(12) United States Patent
Basceri

(10) Patent No.: US 7,399,499 B2
(45) Date of Patent: *Jul. 15, 2008

(54) METHODS OF GAS DELIVERY FOR DEPOSITION PROCESSES AND METHODS OF DEPOSITING MATERIAL ON A SUBSTRATE

(75) Inventor: Cem Basceri, Boise, ID (US)

(73) Assignee: Micron Technology, Inc., Boise, ID (US)

(*) Notice: Subject to any disclaimer, the term of this patent is extended or adjusted under 35 U.S.C. 154(b) by 326 days.

This patent is subject to a terminal disclaimer.

(21) Appl. No.: 11/108,219

(22) Filed: Apr. 18, 2005

(65) Prior Publication Data

US 2005/0191416 A1  Sep. 1, 2005

Related U.S. Application Data

(63) Continuation of application No. 10/222,290, filed on Aug. 15, 2002, now Pat. No. 6,887,521.

(51) Int. Cl.
    *C23C 16/00* (2006.01)
(52) U.S. Cl. .................. 427/248.1; 427/255.7; 438/680
(58) Field of Classification Search .............. 427/248.1, 427/255.7; 438/680
    See application file for complete search history.

(56) References Cited

U.S. PATENT DOCUMENTS 3,110,319 A  11/1963  Arata et al.

(Continued)

FOREIGN PATENT DOCUMENTS

JP  61-5515  1/1986

(Continued)

OTHER PUBLICATIONS

UC Berkeley Extension, Engineering, "Atomic Layer Deposition," Dec. 11, 2001, 5 pages, http://www.unex.berkeley.edu/eng/br335/1-1.html.

(Continued)

*Primary Examiner*—Timothy Meeks
*Assistant Examiner*—Elizabeth A Burkhart
(74) *Attorney, Agent, or Firm*—Wells St. John P.S.

(57) ABSTRACT

Methods for depositing material onto workpieces, methods of controlling the delivery of gases in deposition processes, and apparatus for depositing materials onto workpieces. One embodiment of a method for depositing material onto a workpiece comprises placing a micro-device workpiece having a plurality of submicron features in a reactor proximate to outlet ports of a gas distributor in the reactor. This method also includes flowing a gas from a gas supply to a closed compartment of the reactor until the gas reaches a desired pressure within the compartment, and subsequently dispensing the gas from the outlet ports of the gas distributor. The compartment can be in a reaction chamber of the reactor or outside of the reaction chamber. The gas can be dispensed from the outlet ports by opening an outlet valve between the compartment and the outlet ports while also physically displacing the gas from the compartment. The gas can be displaced from the compartment using a piston, diaphragm, bladder or other type of mechanical actuator. In other embodiments, the gas is displaced from the compartment by driving another type of gas through the compartment while the outlet valve is open. As a result, a known volume or mass of the gas is actively displaced from the compartment by driving the gas out of the compartment with a driver that is separate from the gas itself.

10 Claims, 7 Drawing Sheets

U.S. PATENT DOCUMENTS

| | | |
|---|---|---|
| 4,217,375 A | 8/1980 | Adams |
| 4,273,291 A | 6/1981 | Muller |
| 4,319,737 A | 3/1982 | Waterfield |
| 4,392,915 A | 7/1983 | Zajac |
| 4,444,812 A | 4/1984 | Gutsche |
| 4,513,021 A | 4/1985 | Purdes |
| 4,537,795 A | 8/1985 | Nath et al. |
| 4,545,327 A | 10/1985 | Campbell et al. |
| 4,592,933 A | 6/1986 | Meyerson et al. |
| 4,633,809 A | 1/1987 | Hirose et al. |
| 4,640,221 A | 2/1987 | Barbee et al. |
| 4,716,852 A | 1/1988 | Tsujii et al. |
| 4,724,159 A | 2/1988 | Yamazaki |
| 4,738,748 A | 4/1988 | Kisa |
| 4,747,367 A | 5/1988 | Posa |
| 4,761,269 A | 8/1988 | Conger et al. |
| 4,798,809 A | 1/1989 | Hirooka et al. |
| 4,805,552 A | 2/1989 | Pagendarm et al. |
| 4,872,947 A | 10/1989 | Wang et al. |
| 4,904,621 A | 2/1990 | Loewenstein et al. |
| 4,910,043 A | 3/1990 | Freeman et al. |
| 4,949,669 A | 8/1990 | Ishii et al. |
| 4,965,090 A | 10/1990 | Gartner et al. |
| 4,971,832 A | 11/1990 | Arai et al. |
| 5,000,113 A | 3/1991 | Wang et al. |
| 5,002,928 A | 3/1991 | Fukui et al. |
| 5,068,871 A | 11/1991 | Uchida et al. |
| 5,093,149 A | 3/1992 | Doehler et al. |
| 5,150,734 A | 9/1992 | Chiba |
| 5,275,976 A | 1/1994 | Moslehi |
| 5,284,519 A | 2/1994 | Gadgil |
| 5,304,279 A | 4/1994 | Coultas et al. |
| 5,338,363 A | 8/1994 | Kawata et al. |
| 5,356,120 A | 10/1994 | Konig et al. |
| 5,362,526 A | 11/1994 | Wang et al. |
| 5,366,585 A | 11/1994 | Robertson et al. |
| 5,377,429 A | 1/1995 | Sandhu et al. |
| 5,453,124 A | 9/1995 | Moslehi et al. |
| 5,468,298 A | 11/1995 | Lei et al. |
| 5,480,818 A | 1/1996 | Matsumoto et al. |
| 5,500,256 A | 3/1996 | Watabe |
| 5,522,934 A | 6/1996 | Suzuki et al. |
| 5,532,190 A | 7/1996 | Goodyear et al. |
| 5,547,714 A | 8/1996 | Huck et al. |
| 5,556,474 A | 9/1996 | Otani et al. |
| 5,564,907 A | 10/1996 | Maruyama et al. |
| 5,590,387 A | 12/1996 | Schmidt et al. |
| 5,618,349 A | 4/1997 | Yuuki |
| 5,620,523 A | 4/1997 | Maeda et al. |
| 5,647,912 A | 7/1997 | Kaminishizono et al. |
| 5,674,574 A | 10/1997 | Atwell et al. |
| 5,678,595 A | 10/1997 | Iwabuchi |
| 5,743,457 A | 4/1998 | Benedette et al. |
| 5,746,834 A | 5/1998 | Hanley |
| 5,755,886 A | 5/1998 | Wang et al. |
| 5,772,771 A | 6/1998 | Li et al. |
| 5,792,272 A | 8/1998 | Van Os et al. |
| 5,824,158 A | 10/1998 | Takeuchi et al. |
| 5,827,370 A | 10/1998 | Gu |
| 5,851,294 A | 12/1998 | Young et al. |
| 5,851,849 A | 12/1998 | Comizzoli et al. |
| 5,853,484 A | 12/1998 | Jeong |
| 5,879,459 A | 3/1999 | Gadgil et al. |
| 5,884,009 A | 3/1999 | Okase |
| 5,885,358 A | 3/1999 | Maydan et al. |
| 5,885,751 A | 3/1999 | Weidman et al. |
| 5,908,947 A | 6/1999 | Vaartstra |
| 5,925,411 A | 7/1999 | van de Ven et al. |
| 5,972,430 A | 10/1999 | DiMeo et al. |
| 5,983,906 A | 11/1999 | Zhao et al. |
| 5,993,916 A | 11/1999 | Zhao et al. |
| 6,042,652 A | 3/2000 | Hyun et al. |
| 6,050,506 A | 4/2000 | Guo et al. |
| 6,056,994 A | 5/2000 | Paz de Araujo et al. |
| 6,059,885 A | 5/2000 | Ohashi et al. |
| 6,071,572 A | 6/2000 | Mosely et al. |
| 6,085,690 A | 7/2000 | Mizuno |
| 6,086,679 A | 7/2000 | Lee et al. |
| 6,107,152 A | 8/2000 | Derderian |
| 6,110,531 A | 8/2000 | Paz de Araujo et al. |
| 6,113,078 A | 9/2000 | Rock |
| 6,114,227 A | 9/2000 | Leksell et al. |
| 6,132,512 A | 10/2000 | Horie et al. |
| 6,132,552 A | 10/2000 | Donohoe et al. |
| 6,139,700 A | 10/2000 | Kang et al. |
| 6,143,659 A | 11/2000 | Leem |
| 6,144,060 A | 11/2000 | Park et al. |
| 6,174,377 B1 | 1/2001 | Doering et al. |
| 6,174,809 B1 | 1/2001 | Kang et al. |
| 6,187,101 B1 | 2/2001 | Yoshizawa |
| 6,197,119 B1 | 3/2001 | Dozoretz et al. |
| 6,200,893 B1 | 3/2001 | Sneh |
| 6,203,613 B1 | 3/2001 | Gates et al. |
| 6,228,563 B1 | 5/2001 | Starov et al. |
| 6,237,529 B1 | 5/2001 | Spahn |
| 6,270,572 B1 | 8/2001 | Kim et al. |
| 6,287,965 B1 | 9/2001 | Kang et al. |
| 6,294,026 B1 | 9/2001 | Roithner et al. |
| 6,297,539 B1 | 10/2001 | Ma et al. |
| 6,305,314 B1 | 10/2001 | Sneh et al. |
| 6,312,526 B1 | 11/2001 | Yamamuka et al. |
| 6,333,268 B1 | 12/2001 | Starov et al. |
| 6,344,151 B1 | 2/2002 | Chen et al. |
| 6,419,462 B1 | 7/2002 | Horie et al. |
| 6,426,307 B2 | 7/2002 | Lim |
| 6,444,039 B1 | 9/2002 | Nguyen |
| 6,453,992 B1 | 9/2002 | Kim |
| 6,458,416 B1 | 10/2002 | Derderian et al. |
| 6,503,330 B1 | 1/2003 | Sneh et al. |
| 6,511,539 B1 | 1/2003 | Raaijmakers |
| 6,534,395 B2 | 3/2003 | Werkhoven et al. |
| 6,579,372 B2 | 6/2003 | Park |
| 6,602,784 B2 | 8/2003 | Sneh |
| 6,627,260 B2 | 9/2003 | Derderian et al. |
| 6,638,880 B2 | 10/2003 | Yamamuka et al. |
| 6,656,282 B2 | 12/2003 | Kim et al. |
| 6,677,250 B2 | 1/2004 | Campbell et al. |
| 6,730,613 B1 | 5/2004 | Hwang et al. |
| 6,787,185 B2 | 9/2004 | Derderian et al. |
| 6,793,736 B2 | 9/2004 | Sandhu et al. |
| 6,812,157 B1 | 11/2004 | Gadgil |
| 6,825,126 B2 | 11/2004 | Asai et al. |
| 6,890,596 B2 | 5/2005 | Sarigiannis et al. |
| 6,905,737 B2 | 6/2005 | Verplancken et al. |
| 7,066,194 B2 | 6/2006 | Ku et al. |
| 2001/0045187 A1 | 11/2001 | Uhlenbrock |
| 2002/0129768 A1 | 9/2002 | Carpenter et al. |
| 2002/0155632 A1 | 10/2002 | Yamazaki et al. |
| 2002/0157611 A1 | 10/2002 | Bondestam et al. |
| 2002/0164420 A1* | 11/2002 | Derderian et al. ........ 427/248.1 |
| 2003/0033980 A1 | 2/2003 | Campbell et al. |
| 2003/0045098 A1 | 3/2003 | Verhaverbeke et al. |
| 2003/0194861 A1* | 10/2003 | Mardian et al. ............ 438/680 |
| 2003/0194862 A1 | 10/2003 | Mardian et al. |
| 2003/0215569 A1 | 11/2003 | Mardian et al. |
| 2004/0083959 A1 | 5/2004 | Carpenter et al. |
| 2004/0124131 A1 | 7/2004 | Aitchison et al. |
| 2004/0144310 A1 | 7/2004 | Campbell et al. |
| 2004/0216671 A1 | 11/2004 | Carpenter et al. |

FOREIGN PATENT DOCUMENTS

| | | |
|---|---|---|
| JP | 20-46723 | 2/1990 |
| JP | 02-371361 | 12/2002 |

| | | |
|---|---|---|
| WO | WO 00/79019 | 12/2000 |
| WO | 2003076678 A2 | 9/2003 |

OTHER PUBLICATIONS

IPS Integrated Process Systems, Dec. 11, 2001, 1 page, http://www.ips-tech.com/eng/main.htm.

IPS Integrated Process Systems, Nan-ALD, Dec. 11, 2001, 2 pages, http://www.ips-tech.com/eng/pro-p2.htm.

IPS Integrated Process Systems, Nan-ALD, Dec. 11, 2001, 2 pages, http://www.ips-tech.com/eng/pro-p2-2.htm.

Deublin Company, Precision Rotating Unions, Steam Joints and Siphon Systems "Precision Rotating Connections for Water, Steam, Air, Hydraulic, Vacuum, Coolant and Hot Oil Service," http://www.deublin.com, Feb. 4, 2002, 1 page.

Deublin Company, "Rotating Unions," http://www.deublin.com/products/rotatingunions.htm, Feb. 4, 2002, 1 page.

Deublin Company, "Sealing," http://deublin.com/products/sealing.htm, Feb. 4, 2002, 2 pages.

Electronic Times, "Atomic Layer Deposition Chamber Works at Low Temperatures," 2 pages, Dec. 11, 2001, 2001 CMP Europe Ltd., http://www.electronicstimes.com/story/OEG20010719S0042.

The University of Adelaide Australia, Department of Chemistry, Stage 2 Chemistry Social Relevance Projects, "Spectroscopy," 2 pages, Feb. 9, 2002, http://www.chemistry.adelaide.edu.au/external/Soc-Rel/content/Spectros.htm.

Horii, Sadayoshi, et al., "Metalorganic Chemical Vapor Deposition of $HfO_2$ Films through the Alternating Supply of Tetrakis(1-Methoxy-2-methyl-2-propoxy)-Hafnium and Remote-Plasma Oxygen". Jpn. J. Appl. Phys. vol. 42 (2003), pp. 5176-5180, Part 1, No. 8, Aug. 15, 2003.

Sundqvist, J. et al., "Atomic layer deposition of polycrystalline $HfO2$ Films by the $Hfl4-O2$ precursor combiation". Thin Solid Films. Volume 427, Issues 1-2, Mar. 3, 2003, pp. 147-151.

\* cited by examiner

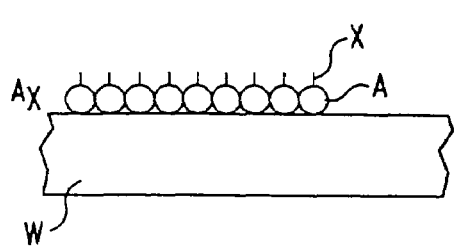
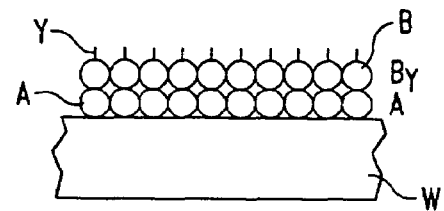
Fig. 1A
(Prior Art)
Fig. 1B
(Prior Art)
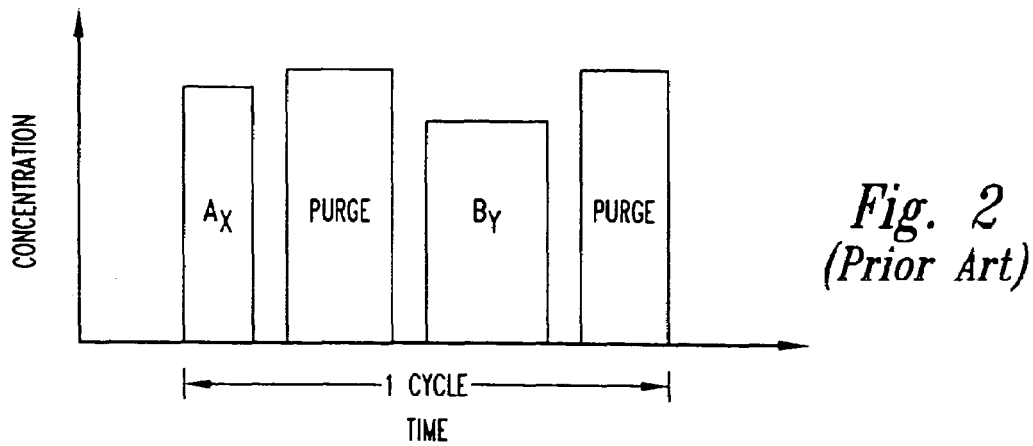
Fig. 2
(Prior Art)
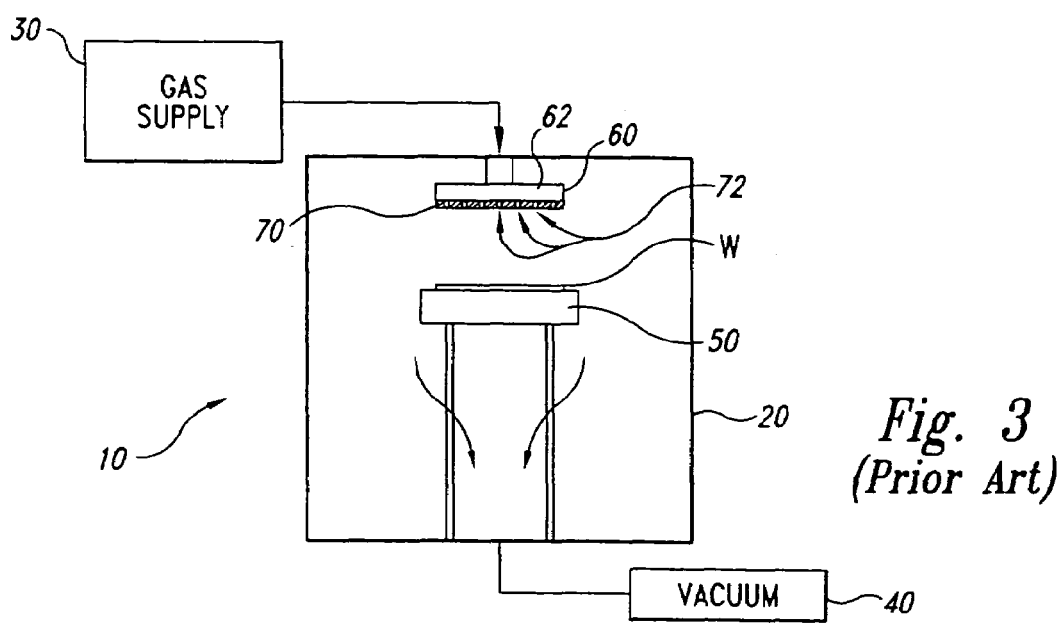
Fig. 3
(Prior Art)

US 7,399,499 B2

METHODS OF GAS DELIVERY FOR DEPOSITION PROCESSES AND METHODS OF DEPOSITING MATERIAL ON A SUBSTRATE

RELATED PATENT DATA

This patent resulted from a continuation application of U.S. patent application Ser. No. 10/222,290, filed Aug. 15, 2002, now U.S. Pat. No. 6,887,521, entitled "Gas Delivery System for Pulse-Type Deposition Processes Used in the Manufacturing of Micro-Devices", naming Cem Basceri as inventor, the disclosure of which is incorporated by reference.

TECHNICAL FIELD

The present invention is related to depositing thin films and, in particular, gas delivery systems used in pulsed-type deposition processes for manufacturing microelectronic devices, micromechanical devices, and other types of micro-devices.

BACKGROUND

Thin film deposition techniques are widely used to form layers of specific materials in the fabrication of semiconductor devices and other micro-devices. The size of the individual components in the devices is constantly decreasing, and the number of layers in the devices is increasing. As a result, the density of components and the aspect ratios of depressions (e.g., the ratio of the depth to the size of the opening) are increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed in a gas or vapor state, and then the precursor mixture is presented to the surface of the workpiece. CVD systems can be continuous flow systems or pulsed-type CVD systems. Continuous flow systems provide a continuous flow of the precursor gases. Pulsed-CVD systems intermittently pulse a mixture of the precursor gases between pulses of a purge gas. The surface of the workpiece catalyzes the reaction between the precursor gases to form a thin, solid film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

Atomic Layer Deposition (ALD) is another thin film deposition technique. FIGS. 1A and 1B schematically illustrate the basic operation of ALD processes. Referring to FIG. 1A, a layer of gas molecules $A_x$ coats the surface of a workpiece W. The layer of $A_x$ molecules is formed by exposing the workpiece W to a precursor gas containing $A_x$ molecules, and then purging the chamber with a purge gas to remove excess $A_x$ molecules. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. The layer of $A_x$ molecules is then exposed to another precursor gas containing $B_y$ molecules. The $A_x$ molecules react with the $B_y$ molecules to form an extremely thin layer of solid material on the workpiece W. The chamber is then purged again with a purge gas to remove excess $B_y$ molecules.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing, several cycles are repeated to build a thin film on a workpiece having the desired thickness. For example, each cycle may form a layer having a thickness of approximately 0.5-1.0 Å, and thus it takes many cycles to form a solid layer having a thickness of approximately 60 Å.

FIG. 3 schematically illustrates an ALD reactor 10 having a reaction chamber 20 coupled to a gas supply 30 and a vacuum 40. The reactor 10 also includes a heater 50 that supports the workpiece W and a gas dispenser 60 in the reaction chamber 20. The gas dispenser 60 includes a plenum 62 operatively coupled to the gas supply 30 and a distributor plate 70 having a plurality of holes 72. The plenum 62 is an open compartment through which the gases pass directly to the holes 72. In operation, the heater 50 heats the workpiece W to a desired temperature, and the gas supply 30 selectively injects the first precursor $A_x$, the purge gas, and the second precursor $B_y$ as described above for ALD or CVD processes. The vacuum 40 maintains a negative pressure in the chamber to draw the gases from the gas dispenser 60, across the workpiece W, and then through an outlet of the reaction chamber 20.

One concern of both the CVD and ALD processes is providing a consistent deposition rate, precise composition, and uniform thickness across the workpiece. These factors are influenced by the parameters of the individual gas flows of the constituent gases. For example, variances in the gas pressures, valve timing and response times can result in inconsistent volumes of precursor gases being dispensed from the gas dispenser. Conventional Pulsed-CVD processes and ALD processes attempt to provide consistent volumes of precursor gases by using more precise valves or mass flow controllers (i.e., flow meters). Although such devices are an improvement, they may not provide sufficiently accurate amounts of precursor gases to the workpiece.

Another concern associated primarily with ALD processing is that it has a relatively low throughput compared to CVD techniques. For example, ALD processing may take several seconds to perform each $A_x$-purge-$B_y$-purge. This results in a total process time of several minutes to form a single layer less than 100 Å thick. In contrast to ALD processing, CVD techniques require much less time to form a layer of the same thickness. The low throughput of existing ALD techniques limits the utility of the technology in its current state because ALD may be a bottleneck in the overall manufacturing process. Thus, it would be useful to increase the throughput of ALD techniques so that they could be used in a wider range of applications.

SUMMARY

The present invention is directed toward methods for depositing material onto workpieces, methods of controlling the delivery of gases in deposition processes, and apparatus for depositing materials onto workpieces. One embodiment of a method for depositing material onto a workpiece comprises placing a micro-device workpiece having a plurality of submicron features in a reactor proximate to outlet ports of a gas distributor in the reactor. This method also includes flowing a gas from a gas supply to a selectively sealable compartment of the reactor until the gas reaches a desired pressure within the compartment, and subsequently dispensing the gas from the outlet ports of the gas distributor. The compartment can be in a reaction chamber of the reactor or outside of the reaction chamber. The gas can be dispensed from the outlet ports by opening an outlet valve between the compartment and the outlet ports while also physically displacing the gas from the compartment. The gas can be displaced from the compartment using a piston, diaphragm, bladder or other type of mechanical actuator. In other embodiments, the gas is displaced from the compartment by driving another type of gas through the compartment while the outlet valve is open. As a result, a known volume or mass of the gas is actively displaced from the compartment by driving the gas out of the compartment with a driver that is separate from the gas itself.

Another embodiment of a method for depositing material onto a workpiece comprises placing a micro-device workpiece having a plurality of submicron features in a reactor proximate to outlet ports of a gas distributor and pressurizing a container of the reactor with a gas until the gas has a desired pressure while preventing the gas from flowing out of the outlet ports. For example, the container can be pressurized with the gas by flowing the gas into the container while an outlet valve of the container is closed. This embodiment of the method also includes actively displacing a volume of the gas from the container to flow the gas through the outlet portstoward the workpiece. The gas can be actively displaced from the container using a mechanical actuator or another gas as explained above.

Other aspects of the invention are directed toward methods of controlling the delivery of gases in processes for depositing material onto a micro-device workpiece. Several embodiments of these methods are practiced using a deposition system having a reactor including a reaction chamber; a gas distributor in the reaction chamber; and a gas supply to provide gas to the gas distributor. The gas distributor includes a plurality of outlet ports configured to dispense gas to the workpiece. One embodiment of a method for controlling the delivery of gases includes flowing a gas from the gas supply to a closed compartment of the chamber until the gas reaches a desired pressure within the compartment. This method further includes dispensing at least a portion of the gas from the outlet ports of the gas distributor by opening an outlet valve between the compartment and the outlet ports and displacing the gas from the compartment.

Another embodiment of a method for controlling the delivery of gases comprises pressurizing a container with a gas to a desired pressure; actively displacing a volume of the gas from the container by driving the gas with a driver separate from the gas; and dispensing the volume of gas from outlet ports of a gas distributor. The container can be pressurized by closing an outlet valve of the container and flowing the gas into the container until the gas reaches the desired pressure. The pressurized gas in the container can then be actively displaced from the container by opening the outlet valve and driving the gas out of the container with a mechanical actuator or another gas. Such mechanical actuators or other types of gases define a driver that is separate from the gas itself. For example, the gas used to pressurize the container can be a first precursor gas and/or a second precursor gas, and the driver that drives the gas from the container can be a purge gas.

The methods for depositing the material onto a workpiece and the methods for controlling the delivery of gases set forth above are particularly useful for Atomic Layer Deposition ("ALD") and Pulsed Chemical Vapor Deposition (Pulsed-CVD) processes. The container can accordingly be pressurized to a desired pressure with either a first precursor gas $A_x$, a second precursor gas $B_y$, and/or a combination of the first and second precursor gases $A_x$ and $B_y$.

Additional aspects of the invention are directed toward deposition systems or gas delivery systems for depositing a material onto a micro-device workpiece. In one embodiment, a deposition system for depositing a material onto a micro-device workpiece comprises a gas supply having at least a first gas and a reactor coupled to the gas supply. The reactor can include a reactor chamber, a workpiece holder in the chamber, and a gas distributor in the chamber proximate to the workpiece holder. The gas distributor can include a plurality of outlet ports positioned relative to the workpiece holder to direct gases to the workpiece. The reactor in this embodiment further comprises a gas container. The gas container can include a selectively sealable compartment, an inlet valve coupled to the gas supply, and an outlet valve in fluid communication with the outlet ports. In operation, the compartment of the gas container is closed to charge the compartment with a gas or otherwise seal the compartment. The compartment is opened by opening the outlet valve. When the outlet valve is open, the pressurized gas in the compartment is then actively displaced to force the gas from the compartment and through the outlet ports to deposit molecules of the gas onto the workpiece.

Another embodiment of a deposition system in accordance with the invention comprises a gas supply having a first gas, a second gas, and a purge gas. The deposition system of this embodiment further includes a reactor comprising a reaction chamber; a workpiece holder in the chamber; a gas distributor having a plurality of outlet ports positioned relative to the workpiece holder to direct gases to the workpiece holder; and a gas compartment having an inlet valve coupled to the gas supply and an outlet valve between the compartment and the outlet ports of the gas distributor. The deposition system further includes a control system having a computer including a computer readable medium containing instructions that (a) cause the compartment to be pressurized with at least one of the gases by opening the inlet valve and closing the outlet valve, and (b) cause a pulse of the gas to be dispensed through the outlet ports by opening at least the outlet valve.

BRIEF DESCRIPTION OF THE DRAWINGS

FIGS. 1A and 1B are schematic cross-sectional views of stages in ALD processing in accordance with the prior art.

FIG. 2 is a graph illustrating a cycle for forming a layer using ALD techniques in accordance with the prior art.

FIG. 3 is a schematic representation of a deposition system including a reactor for depositing a material onto a microelectronic workpiece in accordance with the prior art.

DETAILED DESCRIPTION

The following disclosure describes several embodiments of systems for depositing materials onto micro-device workpieces, methods for depositing materials onto micro-device workpieces, and methods for controlling the delivery of gases in the deposition of materials onto micro-device workpieces. Many specific details of the invention are described below with reference to ALD and Pulsed-CVD deposition techniques that are used to deposit very thin layers on micro-device workpieces. The term "micro-device workpiece" is used throughout to include substrates upon which and/or in which microelectronic devices, micromechanical devices, data storage elements, read/write components, and other features are fabricated. For example, micro-device workpieces can be semiconductor wafers such as silicon or gallium arsenide wafers, glass substrates, insulative substrates, and many other types of materials. The micro-device workpieces typically have very small, submicron features, such as conductive lines, recesses or components that form integrated circuits. The term "gas" is used throughout to include any form of matter that has no fixed shape and will conform in volume to the space available, which specifically includes vapors (i.e., a gas having a temperature less than the critical temperature so that it may be liquified or solidified by compression at a constant temperature). Several embodiments in accordance with the invention are set forth in FIGS. 4-9 and the following text to provide a thorough understanding of particular embodiments of the invention. A person skilled in the art will understand, however, that the invention may have other embodiments that include more or less elements than those shown and described with reference to the embodiments of FIGS. 4-9.

A. Deposition Systems

Figure 4:
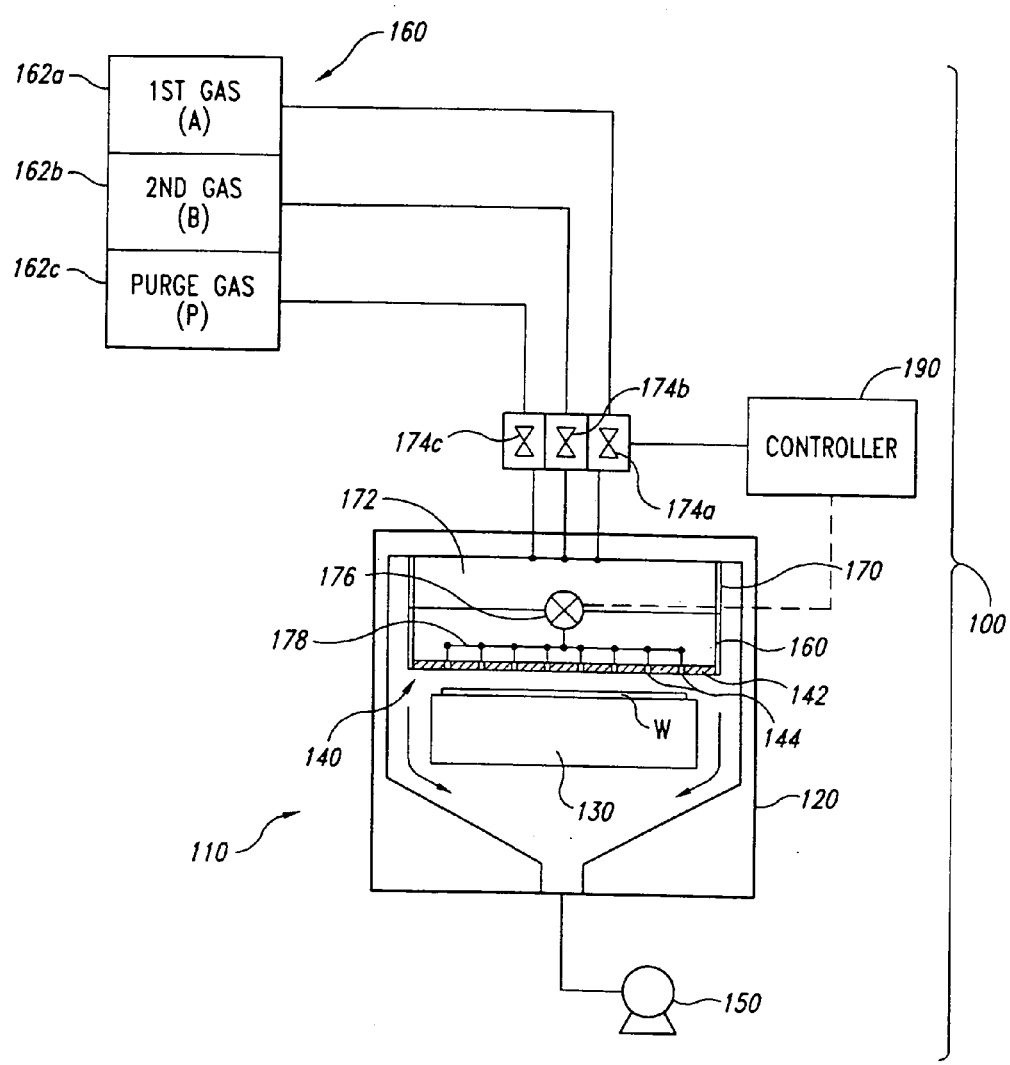
FIG. 4 is a schematic side view of a deposition system for depositing material onto a micro-device workpiece in accordance with one embodiment of the invention.

FIG. 4 is a schematic side view of a deposition system 100 for depositing materials onto a micro-device workpiece W in accordance with one embodiment of the invention. In this embodiment, the system 100 includes a reactor 110 having a reaction chamber 120, a workpiece support 130 in the chamber 120, and a gas distributor 140 in the chamber 120. The workpiece holder 130 can be a heater or heat sink that holds the workpiece at a desired temperature. The gas distributor 140 is positioned over the workpiece holder 130 to deliver gas(es) to the workpiece. In the embodiment shown in FIG. 4, the reaction chamber 120 is coupled to a vacuum 150 to draw gas(es) across the workpiece W and out of the reaction chamber 120. More specifically, the gas distributor 140 can include a distributor plate 142 having a plurality of outlet ports 144 through which the gas(es) flow to the workpiece W.

The system 100 can further include a gas supply assembly 160 that provides one or more gases to the reactor 110. The gas supply assembly 160, for example, can include a first gas source 162$a$, a second gas source 162$b$, and a third gas source 162$c$. The first gas source 162$a$ can provide a first precursor gas A, the second gas source 162$b$ can provide a second precursor gas B, and the third gas source 162$c$ can provide a purge gas P. It will be appreciated that the gas supply assembly 160 can have other embodiments that provide more precursor gases and/or more purge gases. The specific gas sources in the gas supply assembly 160 accordingly depend upon the specific application and materials that are deposited onto the workpiece W.

The system 100 further includes a gas control system for dispensing an accurate mass of each type of gas to the workpiece W. The gas control system can include a gas container 170 that is a component of the reactor 110. The gas container 170, for example, can be in the reaction chamber 120 (as shown in FIG. 4), or the gas container 170 can be outside of the reaction chamber 120 in other embodiments. The gas container 170, more specifically, can be in the gas distributor 140 or just upstream from the gas distributor. The gas container 170 can include one or more compartments 172, at least one inlet valve 174 (identified individually by reference numbers 174$a$-$c$), and at least one outlet valve 176. The inlet valves 174$a$-$c$ can be coupled to corresponding gas sources 162$a$-$c$. The outlet valve 176 can be coupled to the outlet ports 144 by a system of dedicated gas lines 178. It will be appreciated that the gas lines 178 are not necessary, and that a separate plenum between the distributor plate 142 and the outlet valve 176 can be used to provide fluid communication between the outlet valve 176 and the outlet ports 144.

The inlet valves 174$a$-$c$ and the outlet valve 176 are controlled by a controller 190 to form layers of materials on the workpiece W using either ALD, CVD, or Pulsed-CVD processing techniques. As explained in more detail below, the outlet valve 172 is closed to charge or otherwise pressurize the compartment 172 of the gas container 170 with a gas. The pressure of the gas in the closed compartment 172 can be adjusted to provide the desired mass of a precursor gas for ALD or Pulsed-CVD processes. Once the pressure in the compartment reaches a desired level, the outlet valve 176 can be opened and the gas in the compartment 172 can be actively displaced or discharged from the compartment 172 The embodiments of the gas control systems shown in FIGS. 4-9 are expected to provide accurate control of the quantity of gas molecules dispensed to the workpiece W to enhance the control of the deposition rate, composition, and uniformity of the deposited layer.

B. Gas Control Systems

Figure 5:
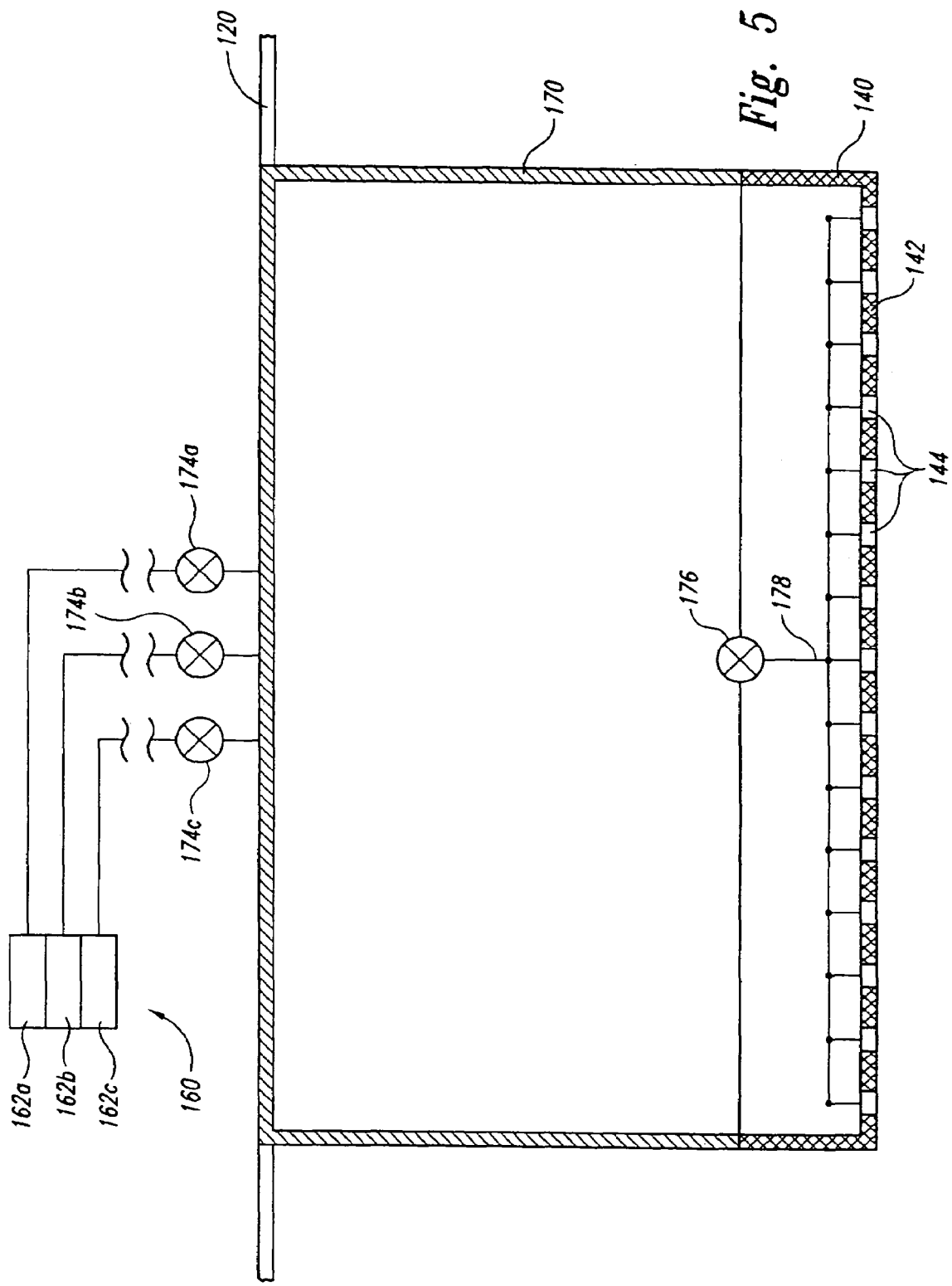
FIG. 5 is a schematic cross-sectional view of a gas distributor and a gas container in accordance with an embodiment of the invention.

FIG. 5 is a schematic cross-sectional view of the gas distributor 140 and the container 170 of the embodiment shown in FIG. 4. One method for controlling the delivery of gases in processes for depositing material onto a micro-device workpiece includes flowing a gas from the gas supply 160 to the compartment 172 until the gas reaches a desired pressure within the compartment. The compartment 172 can be closed (i.e., selectively sealed) during this stage by closing the outlet valve 176, and the incoming gas can pass through either the first inlet valve 174$a$, the second inlet valve 174$b$, and/or the third inlet valve 174$c$. Because the outlet valve 176 is closed and the volume of the compartment 172 is fixed, the pressure in the compartment corresponds to a known quantity of gas molecules for each type of gas at a known temperature. Once the gas in the compartment 172 reaches a desired pressure range corresponding to the mass of gas for a gas pulse, the outlet valve 176 is opened while the gas in the compartment 172 is displaced or otherwise driven from the compartment 172. The gas in the compartment 172 accordingly flows through the gas lines 178 and out through the outlet ports 144 to be deposited on a workpiece (not shown in FIG. 5). In the embodiment shown in FIG. 5, the driver that displaces the pressurized gas from the compartment 172 is another gas different than the pressurized gas.

One embodiment for operating the gas control system shown in FIG. 5 is directed toward ALD processing techniques. In this embodiment, the compartment 172 is pressurized with the first precursor gas A by closing the outlet valve 176 and opening the first inlet valve 174a to flow the first precursor gas A into the compartment 172. Once a desired mass of the first precursor gas A is in the compartment 172, then the first inlet valve 174a is closed; the third inlet valve 174c is opened; and the outlet valve 176 is also opened. The purge gas P accordingly flows into the compartment 172 to drive the pressurized first precursor gas A through the outlet valve 176, the gas lines 178, and the outlet ports 144. The purge gas P can continue flowing through the compartment 172 while the outlet valve 176 is open to provide a purge cycle. To terminate the purge cycle, the third inlet valve 174c is closed and the second inlet valve 174b is opened. The outlet valve 176 can remain open for a short period of time after opening the second inlet value 174b to flush the purge gas P from the compartment 172 with the second precursor B. Once the purge gas P is flushed from the compartment 172 by the second precursor B, the second outlet valve 176 is closed while the flow of the second precursor B continues to pressurize the compartment 172 with the second precursor B. After a desired mass of the second precursor B is in the compartment 172, the second inlet valve 174b is closed, the third inlet valve 174c is opened, and the outlet valve 176 is also opened. The purge gas P accordingly drives the second precursor B from the compartment 172 to flow the second precursor B out through the outlet ports 144. This cycle is repeated to deposit the first precursor A, purge excess molecules of the first precursor A, deposit the second precursor B, and then purge the excess molecules of the second precursor B to form a thin layer of material on the workpiece.

The gas control system shown in FIG. 5 can also be used in Pulsed-CVD processing techniques. In one embodiment, the compartment 172 is pressurized with both the first and second precursors A and B at the same time by opening the first and second inlet valves 174a and 174b while the outlet valve 176 is closed. After the pressure in the compartment 172 reaches a desired level, the first and second inlet valves 174a and 174b are closed, the third inlet valve 174c is opened, and the outlet valve 176 is also opened to drive the mixture of the first and second precursors A and B from the compartment 172. This cycle is repeated until a layer of material is deposited onto the workpiece.

In either the ALD or the Pulsed-CVD applications, one embodiment of a method for controlling the delivery of gases comprises pressurizing a container with a gas to a desired pressure; actively displacing a volume of the gas from the container by driving the gas with a driver separate from the gas; and dispensing the volume of gas from the outlet ports of the gas distributor. Another embodiment of a method for controlling the delivery of gases comprises filling a container of a reactor with a desired mass of a precursor gas for a pulse of the precursor gas; actively displacing the precursor gas from the container by driving the precursor gas with a driver separate from the precursor gas; and dispensing the mass of the precursor gas from the outlet ports of a gas distributor in the reactor. The driver can be a gas or fluid that is separate from the particular precursor gas(es) in the compartment. As explained in more detail below, the driver can alternatively be a mechanical actuator.

Figure 6:
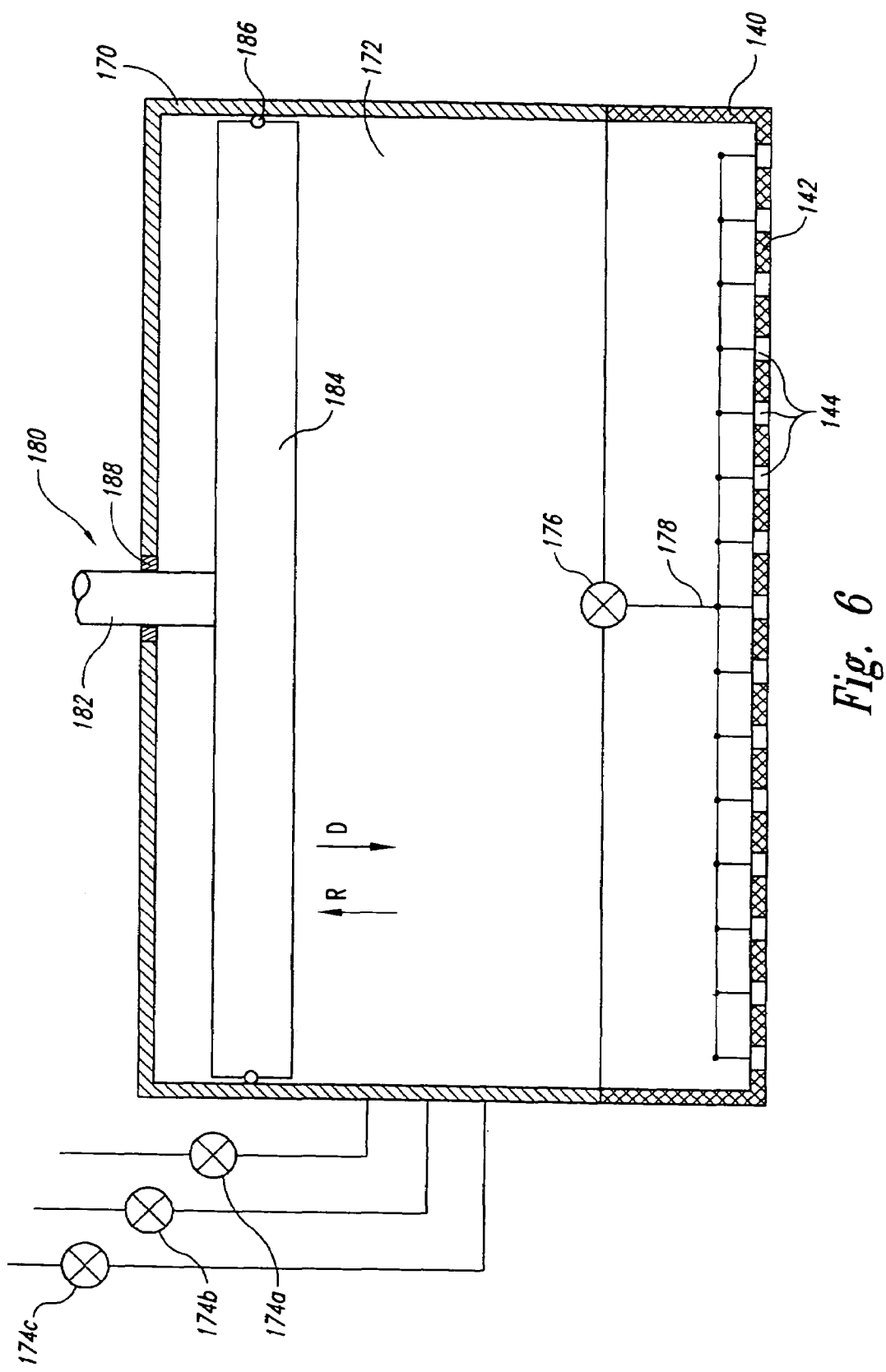
FIG. 6 is a cross-sectional view of a gas distributor and a gas container in accordance with another embodiment of the invention.

FIG. 6 is a schematic cross-sectional view of a gas distributor 140 and a container 170 in accordance with another embodiment of the invention. In this embodiment, the gas control system further includes a mechanical driver 180 in the container 170. The mechanical driver 180 can be a piston assembly having a drive shaft 182, a head 184 at one end of the drive shaft 182, and a ring 186 around the head 184. The drive shaft 182 can be sealed to the container 170 by a seal 188. The mechanical actuator 180 can move between a first or retracted position (arrow R) and a second or discharge position (arrow D).

In operation, a method of controlling the delivery of gases in deposition processes comprises pressurizing the container 170 with the first precursor A and/or the second precursor B. For example, the container 170 can be pressurized by flowing the first precursor A from the gas supply to the compartment 172 when the outlet valve 176 is closed and the mechanical actuator 180 is in a retracted position. The flow of the first precursor A is terminated when the pressure of the first precursor A reaches a desired pressure within the closed compartment 172. The first precursor A is then dispensed from the outlet ports 144 by opening the outlet valve 176 and displacing the first precursor gas from the compartment 172. The first precursor A is displaced from the compartment 172 by driving the piston head 184 toward the distributor plate 142 from the first position to the second position. After a sufficient mass of the first precursor is displaced from the compartment 172, the first inlet valve 174a is closed and the third inlet valve 174c is opened to purge the compartment 172 with a purge gas P. The mechanical actuator 180 can be retracted to the first position during the purge cycle (arrow R). After the purge cycle, the compartment 172 is pressurized with the second precursor B by closing the outlet valve 176 and opening the second inlet valve 174b. The flow of the second precursor B continues until the pressure in the container 170 reaches a desired pressure. The outlet valve 176 is then opened and the mechanical actuator 180 is moved from the first position to the second position to drive the volume of the second precursor B out through the outlet ports 144. The third inlet valve 174c is opened after the mechanical actuator 180 returns to the retracted position to provide a purge cycle. These cycles are then repeated to perform an ALD process using a mechanical actuator.

The embodiment of the gas control system shown in FIG. 6 can also be used to perform Pulsed-CVD processing techniques. It will be appreciated that Pulsed-CVD techniques can be implemented by pressurizing the chamber with both the first precursor A and the second precursor B by opening the first and second inlet valves 174a and 174b until the pressure reaches a desired level. The first and second inlet valves 174a and 174b are then closed, the outlet valve 176 is opened, and the mechanical actuator 180 is moved downwardly toward the distributor plate 142 to dispense the first and second precursors from the outlet ports 144. A purge gas can be passed through the compartment 172 to the workpiece in a manner similar to the ALD processing technique explained above.

Figure 7:
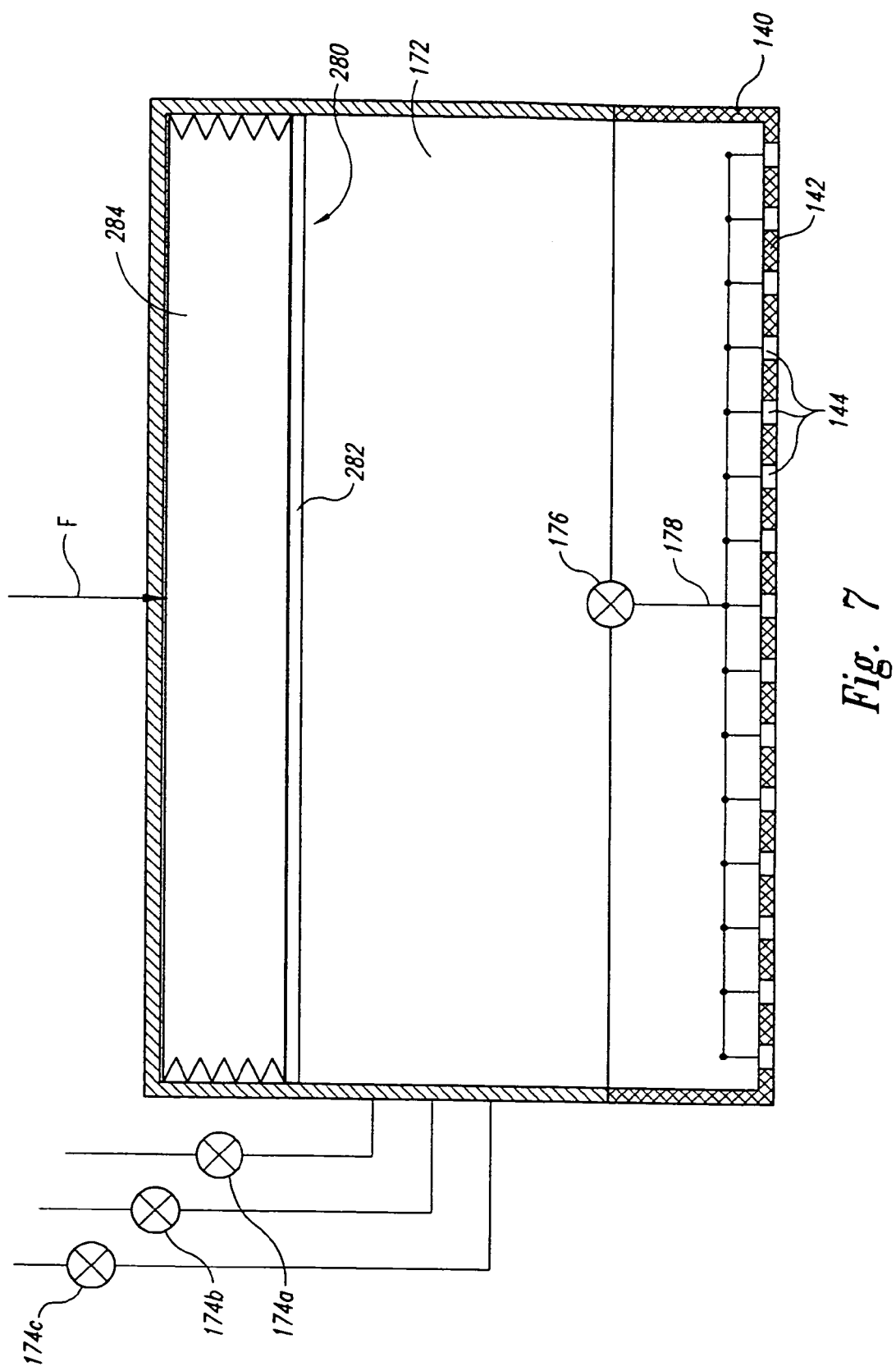
FIG. 7 is a cross-sectional view of a gas distributor and a gas container in accordance with still another embodiment of the invention.

FIG. 7 is a schematic cross-sectional view of another gas assembly that includes a mechanical actuator 280 in accordance with another embodiment of the invention. In this embodiment, the mechanical actuator 280 is a diaphragm 282 having a cavity 284 that can be filled with a drive fluid F. In operation, the drive fluid F flows into the cavity 284 to expand the diaphragm 282 and drive the particular gas from the compartment 272. The embodiment of the gas control system shown in FIG. 7 is expected to operate in a manner similar to that described above with respect to FIG. 6.

Figure 8:
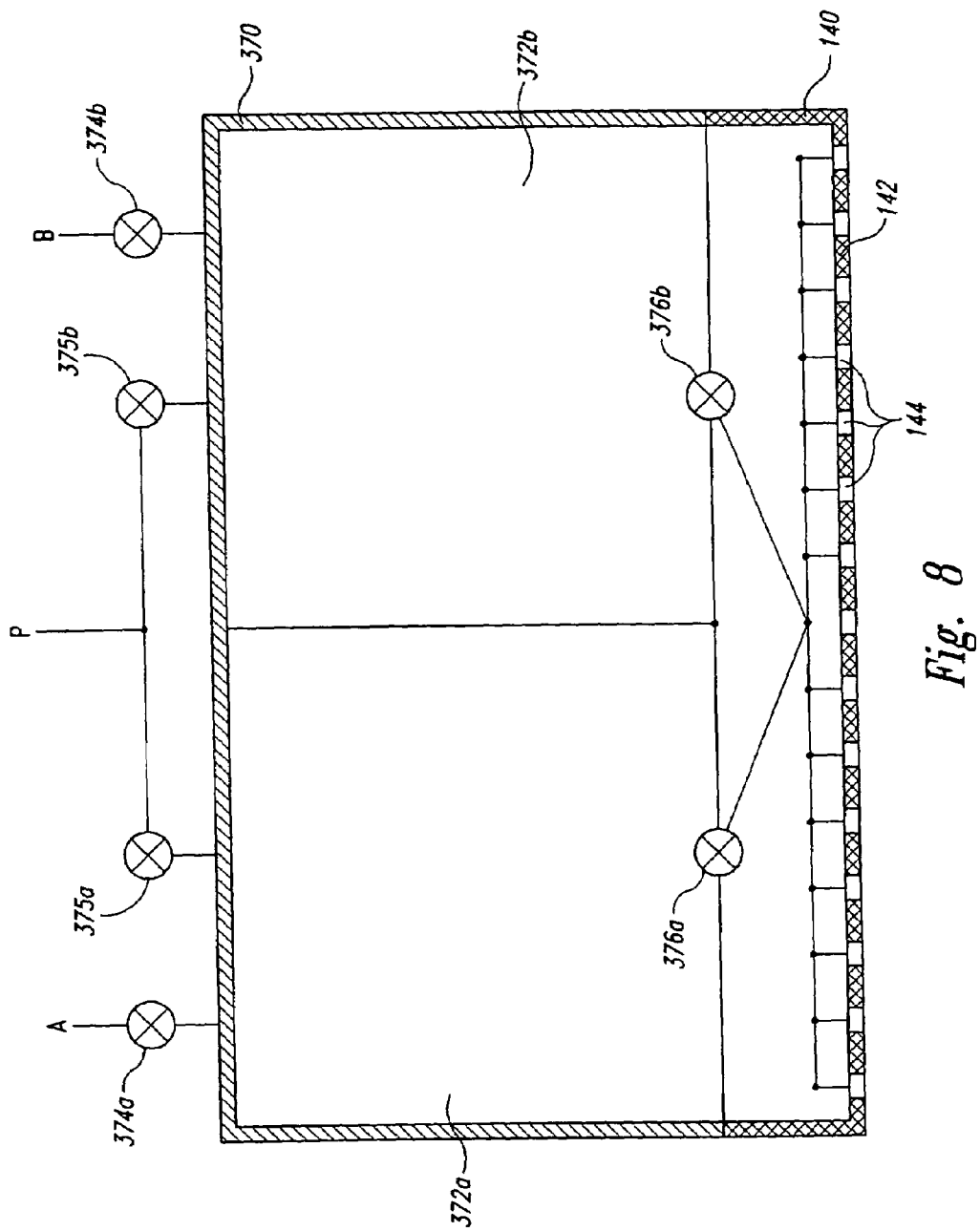
FIG. 8 is a cross-sectional view of a gas distributor and a gas container in accordance with yet another embodiment of the invention.

FIG. 8 is a cross-sectional view of another embodiment of a gas supply system having a container 370 that includes a first compartment 372a and a second compartment 372b. The container 370 can be a component of the gas distributor 140, or the container 370 can be a separate component upstream from the gas distributor 140. The first container 372a can include a first inlet valve 374a coupled to the source of the first precursor gas A, a second inlet valve 375a coupled to the source of the purge gas P, and a first outlet valve 376a. The second compartment 372b can include a first inlet valve 374b coupled to the source of the second precursor B, a second inlet valve 375b coupled to the source of the purge gas P, and a second outlet valve 376b. The first and second outlet valves 376a and 376b are coupled to the outlet ports 144 of the gas distributor 140 via gas lines 378 or another type of passageway, such as a plenum. The embodiment of the container 370 shown in FIG. 8 can be operated by independently charging and discharging gases from the first and second compartments 372a and 372b to perform ALD or CVD processes.

In one embodiment for ALD processing, the gas control system shown in FIG. 8 is operated by charging the first compartment 372a with the first precursor A and charging the second compartment 372b with the second precursor B. The first and second compartments 372a and 372b can be charged independently from each other to enhance the flexibility and throughput of ALD and Pulsed-CVD processes. The first compartment 372a is pressurized by closing the first outlet valve 376a and opening the first inlet valve 374a. Similarly, the second compartment 372b is charged independently by closing the second outlet valve 376b and opening the second inlet valve 374b. Once the first and second compartments are initially charged, the first precursor A is discharged from the first compartment 372a by opening the first outlet valve 376a and opening the second inlet valve 375a of the first compartment 372a. The purge gas P accordingly flows through the second inlet valve 375a of the first compartment 372a to drive the first precursor A through the first outlet valve 376a and out through the outlet ports 144. After the pulse of the first precursor A, the purge gas P continues to flow from the first outlet valve 176a to purge excess molecules of the first precursor A from the workpiece. After the purge cycle, the first outlet valve 176a is closed and the first compartment 372a is recharged with the first precursor A by opening the first inlet valve 374a of the first compartment 372a. While the first compartment 372a is being recharged with the first precursor A, a pulse of the second precursor B is contemporaneously applied to the workpiece by opening the second outlet valve 376b and the second inlet valve 375b of the second compartment 372b. The second precursor B in the second compartment 372b accordingly flows through the gas lines 378 and out of the outlet ports 144 to the workpiece while the first compartment is being recharged with the first precursor. The purge gas P continues to flow through the second inlet valve 375b of the second compartment 372b to purge excess molecules of the second precursor B from the workpiece. After this purge cycle is complete, the second outlet valve 176b is closed and the second compartment 372b is recharged with the second precursor B. By the time the purge cycle of the second precursor B is complete, the first compartment 372a has been recharged with the first precursor A. The first outlet valve 376a can be opened and the second outlet valve 376b can be closed to discharge the first precursor A from the first compartment 372a while the second compartment 372b is recharged with the second precursor B. This procedure can be repeated several times to continuously charge and recharge the first and second compartments 372a and 372b with the precursors.

Figure 9:
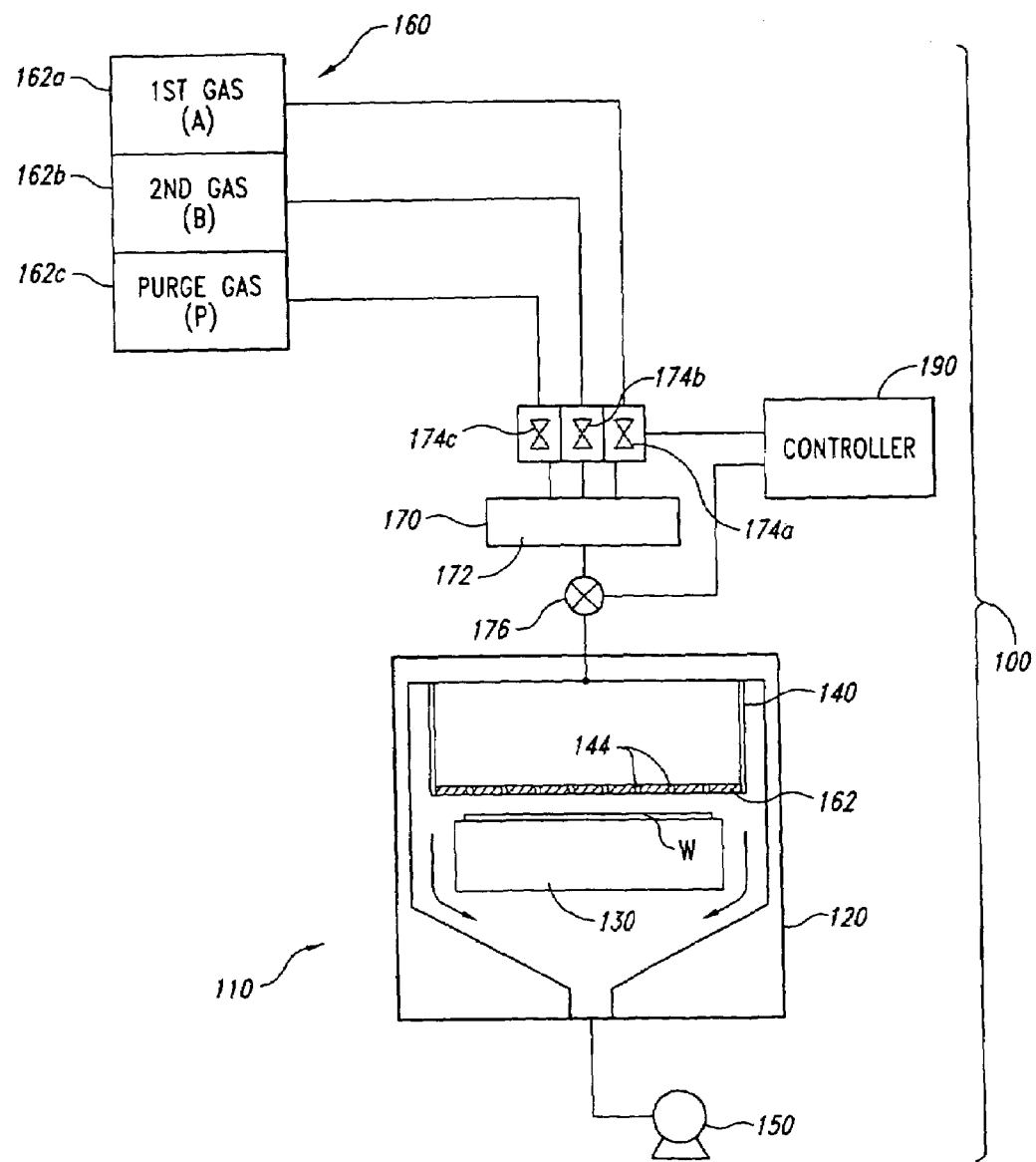
FIG. 9 is a schematic side view of another deposition system for depositing material onto a micro-device workpiece in accordance with another embodiment of the invention.

FIG. 9 is a schematic side view of another embodiment of a system 900 in accordance with the invention. Like reference numbers refer to like components in FIGS. 4 and 9. In this embodiment, the container 170 is outside of the reaction chamber 120 but is considered a component of the reactor 110. The container 170 accordingly does not need to be within the reaction chamber 120, but rather is downstream from the gas sources and upstream from the distributor plate 142. The system 900 is expected to operate in a manner similar to any of the systems explained above with reference to FIGS. 4-8.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of delivering gas in a deposition system comprising:
   providing a reaction chamber containing a substrate holder, a gas container, and a gas distributor disposed between the substrate holder and the gas container, the gas container being configured to selectively provide gas from the gas container through the gas distributor;
   flowing a gas into the gas container to an initial gas volume; and
   utilizing a mechanical actuator, decreasing the initial volume within the gas container.

2. The method of claim 1 wherein the mechanical actuator comprises a piston.

3. The method of claim 1 wherein the mechanical actuator comprises a diaphragm.

4. The method of claim 3 wherein the decreasing the volume of the gas comprises flowing a fluid into a cavity of the diaphragm.

5. The method of claim 1 wherein the decreasing the volume of the gas comprises displacement of at least some of the gas from the gas container through the gas distributor.

6. A method of depositing material onto a substrate comprising:
   providing a substrate within a reaction chamber;
   flowing a gas into a container within the reaction chamber, the container being configured to selectively provide gas from the container through a gas distributor;
   retaining the gas within the container until a desired pressure is achieved;
   displacing at least some of the gas from the container through the gas distributor utilizing a mechanical actuator; and
   contacting the substrate with the gas.

7. The method of claim 6 wherein the gas is a first gas, and further comprising:
   after displacing at least some of the first gas, flowing a purge gas through the container;
   flowing a second gas into the container;
   retaining the second gas within the container until a desired pressure is achieved;

displacing at least some of the second gas from the container through the gas distributor utilizing the mechanical actuator; and contacting the substrate with the second gas.

8. The method of claim 7 wherein the first gas comprises a first precursor and the second gas comprises a second precursor.

9. The method of claim 6 wherein the gas comprises a first precursor and a second precursor.

10. The method of claim 6 wherein the mechanical actuator comprises a piston head within the container, wherein the piston head is in a first position during the flowing the gas into the container, and wherein the displacing comprises moving the piston head to a second position within the container.

* * * * *

UNITED STATES PATENT AND TRADEMARK OFFICE
CERTIFICATE OF CORRECTION

| | | |
|---|---|---|
| PATENT NO. | : 7,399,499 B2 | Page 1 of 1 |
| APPLICATION NO. | : 11/108219 | |
| DATED | : July 15, 2008 | |
| INVENTOR(S) | : Basceri | |

It is certified that error appears in the above-identified patent and that said Letters Patent is hereby corrected as shown below:

In column 1, line 11, delete "Pulse-Type" and insert -- Pulsed-Type --, therefor.

Signed and Sealed this

Seventh Day of October, 2008

JON W. DUDAS
*Director of the United States Patent and Trademark Office*